United States Patent [19]
Corrons et al.

[11] 3,962,654
[45] June 8, 1976

[54] MULTIPLE DIODE MICROWAVE OSCILLATOR APPARATUS

[75] Inventors: Bill E. Corrons, Montclair; James F. Barker, Twenty Nine Palms, both of Calif.

[73] Assignee: General Dynamics Corporation, Pomona, Calif.

[22] Filed: Apr. 7, 1975

[21] Appl. No.: 565,997

[52] U.S. Cl. .............................. 331/56; 331/101; 331/107 R
[51] Int. Cl.² ...................................... H03B 7/14
[58] Field of Search ............... 331/46, 56, 96, 101, 331/102, 107 R, 107 G

[56] References Cited
UNITED STATES PATENTS

| | | | |
|---|---|---|---|
| 3,605,034 | 9/1971 | Rucker et al. | 331/107 R X |
| 3,662,285 | 5/1972 | Rucker | 331/107 R |

Primary Examiner—Siegfried H. Grimm
Attorney, Agent, or Firm—Henry M. Bissell; Edward B. Johnson

[57] ABSTRACT

Novel apparatus is provided which permits the additive combination of the peak pulse power from multiple avalanche diodes operating in the IMPATT mode without spurious signal generation and includes the use of radially disposed combinations of avalanche diodes and coaxial transmission line resonators feeding a common signal output coupler.

22 Claims, 4 Drawing Figures

MULTIPLE DIODE MICROWAVE OSCILLATOR APPARATUS

BACKGROUND OF THE INVENTION

1. Field of the Invention

This invention relates to apparatus for the generation of radio-frequency power at microwave frequencies and more specifically to apparatus for combining the power generated by a plurality of individual semiconductor devices without producing undesirable modes of oscillation or destructive interaction between the semiconductor devices that are generating the power.

2. Description of the Prior Art

In the past, the generation of power by semiconductor devices operating in the negative resistance region has been severely limited in the amount of power that has been obtainable. As a result, various efforts have been undertaken to permit the combination of the power generated by the individual semiconductor oscillators. However, the combining networks of the past have been complex and, further, often produced oscillations at various undesired frequencies and with varying degrees of instability. This was particularly true in devices operating at the microwave frequencies because the physical sizes of the units involved easily become important multiples of a quarter wavelength at the operating frequencies, thus producing, or tending to produce, multiple resonances of the circuits including the semiconductor devices.

Further, oscillators including multiple diodes, particularly when they are pulsed to levels of 10 to 20 watts with 20% to 30% duty cycles, may generate such quantities of heat that destruction of the diode junctions is a distinct possibility. At the same time, resorting to such devices as klystrons, traveling wave tubes, backward-wave oscillators and magnetrons is not an acceptable course of action, particularly in those applications where compactness and minimal weight are paramount. Thus, solving the problems of spurious moding, limited power and destructive heat-rise in the semiconductor devices utilized in such microwave oscillators is the only acceptable course of action.

Accordingly, it is a general object of this invention to provide a semiconductor microwave oscillator which is free of the problems set forth hereinbefore.

It is a further object of this invention to provide a microwave oscillator which permits paralleling the semiconductor devices utilized in the oscillator without experiencing undesirable spurious frequency generation or semiconductor device deterioration.

It is a still further object of this invention to provide a microwave oscillator which utilizes multiple avalanche diodes operating in the IMPATT mode and coupled in parallel for increased output without suffering from spurious oscillations.

SUMMARY OF THE INVENTION

In brief, apparatus in accordance with the present invention comprises a plurality of avalanche diodes operating in the IMPATT mode with each coupled to and driving a coaxial transmission line having a length equal to one-fourth of the wavelength at the desired operating frequency, thus forming a plurality of signal generating units. The signal generating units are disposed radially about a common axis in a metallic housing having good heat and RF conductivity characteristics. In fact, the outer conductor of each transmission line is formed by the wall of a cylindrical opening formed in the housing, those openings being disposed radially in the housing about its axis. Each avalanche diode is held in position by a collet which grips and electrically grounds one end of the diode to the metallic housing. The collet also conducts heat from the diode to the metallic housing which acts as a heat sink. The end of the diode not gripped by the collet is moved into firm electrical contact with the inner conductor of its associated coaxial transmission line by adjusting, axially, the inner and outer-threaded cylinder which carries each collet within the threaded wall of its associated radially-disposed opening in the metallic housing.

The remaining, or voltage anti-node, end of each inner conductor of each transmission line is proximate to the axis of the housing and to the end of each other transmission line. An output plate connected to the inner conductor of the output connector from the package is positioned proximate to the ends of all the coaxial transmission lines and capacitively couples the power from all of the signal generating units through a common output connector. Input power to each of the diodes is provided through a common axially-located conductor, individual parasitic suppression resistor elements and the individual coaxial transmission line inner conductors to which one end of each diode is connected. The return current path for all the diodes is, of course, through the common metallic housing.

BRIEF DESCRIPTION OF THE DRAWINGS

A better understanding of the invention may be had from a consideration of the following detailed description, taken in conjunction with the accompanying drawings, in which.

DESCRIPTION OF THE PREFERRED EMBODIMENT

Figure 1:
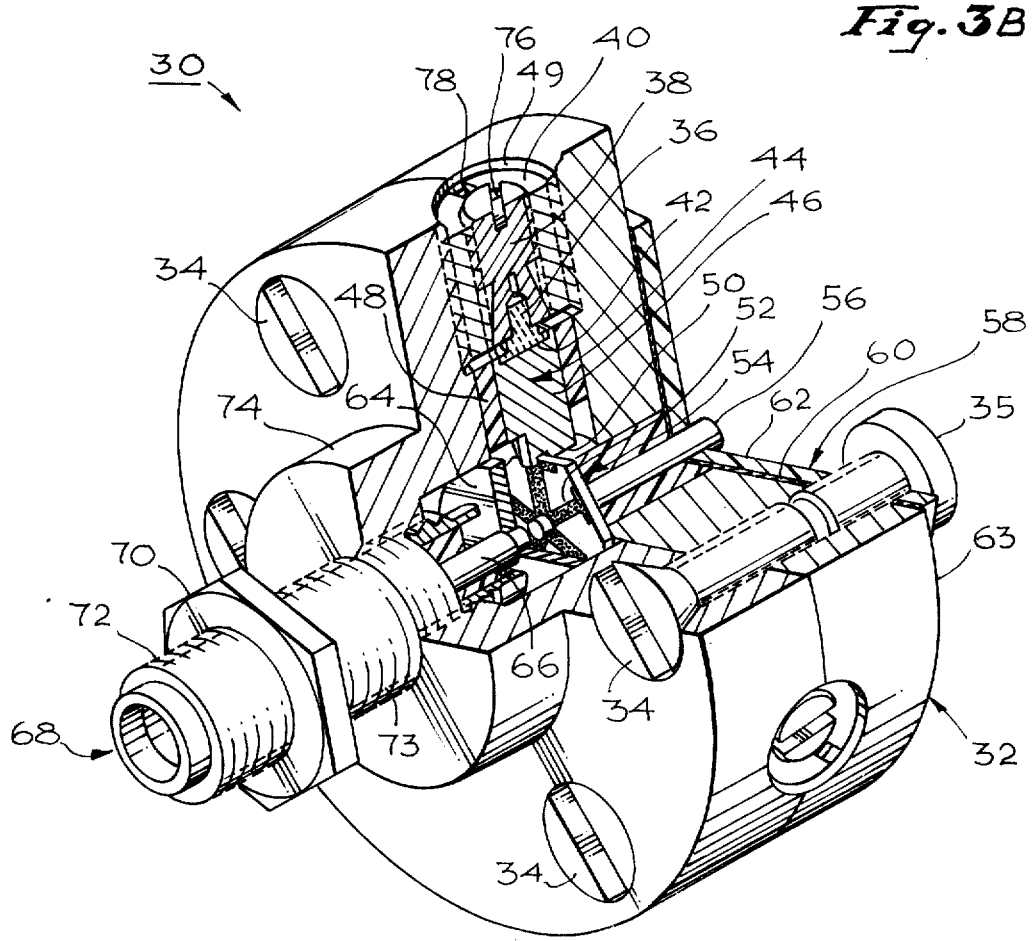
FIG. 1 is an isometric view, partially in section and partially cut away, showing the oscillator apparatus according to the present invention.

In FIG. 1, a six-diode oscillator 30 has a housing 32, which may be of aluminum or other material with good heat-conducting characteristics. As can be seen from FIG. 1, for ease of assembly of oscillator 30 the housing 32 is made up of two sections which are held together by a plurality of screws 34. A plurality of IMPATT diodes 36 are each held at one end by one of a plurality of collets 38, each of such collets being adjustably supported in a housing 32 by means of one of collet holders 40, thereby holding one end of each IMPATT diode 36 at ground potential. The details of the diode support structure are set forth more clearly in FIG. 2. A remaining terminal 42 of each IMPATT diode 36 is held in firm contact with one of a plurality of transmission lines 44, each of which includes an inner conductor 46, a cylindrical inner wall 49 of the housing 32 surrounding the inner conductor 46 and a dielectric spacer 48, of polystyrene or the like, separating the inner conductor 46 from the inner wall 49. Each coaxial transmission line 44 has an effective length of one-quarter wavelength at the desired frequency of oscillation. Each combination of an IMPATT diode and a transmission line forms a signal generating unit. During operation, a voltage anti-node is developed at the end 50 of each transmission line 44 and, as can be seen from FIG. 1, each inner conductor 46 at that end is slotted to form a snug fit over and make electrical contact with a parasitic suppression resistor 52 which is deposited on a resistor plate in the form of a dielectric substrate 54. The substrate 54 carries a parasitic resistor element for each IMPATT diode and transmission line combination in the oscillator 30. The end of each parasitic-suppression resistor 52 remote from the inner conductor 46 makes electrical connection with a bias input line 56. That line is connected to the parasitic-suppression resistors associated with each of the other IMPATT diodes and transmission lines. Experiments have shown that these series resistances in the biasing and modulating lines to the IMPATT diodes reduce spurious modes of oscillation in the system by dissipating the initially small spurious signals before they can regenerate. A bias plate 58 has a conductive surface 60 over a dielectric substrate 62, that substrate being held in position against a side 63 of the housing 32 by a plurality of screws 35 of nylon or other electrically non-conductive material. The conductive surface 60 makes contact with the bias line 56 and acts, in combination with the side 63, as a by-pass condenser for RF currents present in the bias line 56, thus shorting those currents to the grounded housing 32. An RF coupling plate 64 is adjustably positioned proximate to the ends of the transmission lines 44, remote from the diodes 36, and capacitively couples the power developed by each signal generating unit into an inner conductor 66 of a common RF output connector 68. A hex nut 70 is fixed with respect to an outer conductor 72 of the output connector 68. The output connector 68 has a threaded male portion 73 cooperating with female threads in a hub 74 of the housing 32. The inner conductor 66, which carries the plate 64, moves with the outer conductor 72 so that, upon rotation of hex nut 70, the spacing of coupling plate 64 with respect to each end 50 of the coaxial transmission lines 44 will be changed and, correspondingly, the amount of power coupled into the inner conductor 66 of the output connector 68 from the signal generating units and the load upon those units will vary. The biasing, either by fixed dc bias or by pulse biasing, and the necessary modulating signal, are applied to the diodes 36 through a path including the bias line 56, the parasitic-suppression resistors 52 and the transmission lines 44. Of course, the ground side of the bias and modulating signal sources is connected to the housing 32, to which one terminal of each of the diodes 36 is grounded.

When reducing this invention to practice, the diodes used were IMPATT diodes from Hewlett Packard Company of Palo Alto, California. When approximately 110 volts in either dc or pulse form is applied to these diodes they are at the breakdown or avalanche point. However, to derive power output at the millimeter wavelengths contemplated herein it is necessary to pulse them further in an amount of from 20 to 30 volts with a signal at a repetition rate in the video range of frequencies. These dc bias and pulse voltages are applied through the path recited hereinbefore. If pulse biasing is used, the width of the biasing pulse is approximately one-half microsecond with an amplitude of 110 volts and the additional pulse to produce RF output from the avalanche action may be one-fourth microsecond in width. The duty cycle at which these diodes have been operated runs from 20% to 30%.

Figure 2:
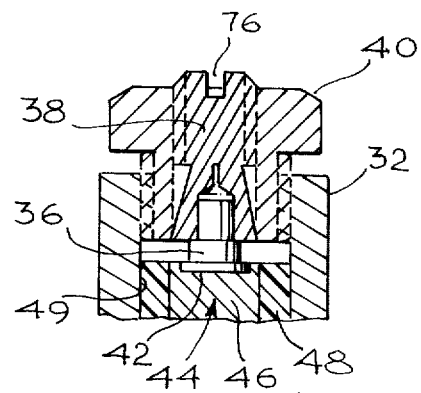
FIG. 2 is a sectional view of one of the diode support elements of FIG. 1.

Referring to both FIGS. 1 and 2, the diode holder made up of the collet 38, the inner and outer-threaded collet sleeve 40 and an internally threaded cylindrical opening 79 in the housing 32 into which the collet sleeve 40 is threaded is an important element in this invention in that it provides a very effective heat sink for IMPATT diode 36 and, at the same time, permits axial adjustment of the positioning of each IMPATT diode 36 so that its end 42 is in firm contact with the inner conductor 46 of the transmission line 44 which it drives. The diode holder may be adjusted as follows. When threaded collet 38 is turned clockwise, as seen in FIG. 1, by means of a slotted head 76, the collet grips the upper portion of the IMPATT diode 36, making a firm mechanical, electrical and heat-conductive connection therewith. The position of the threaded cylinder 40 may then be adjusted by means of a slot 78 (seen in FIG. 1), until end 42 of IMPATT diode 36 is in firm contact with transmission line inner conductor 46, which may be of brass and may be gold-plated to provide improved conductivity.

Figure 3A:
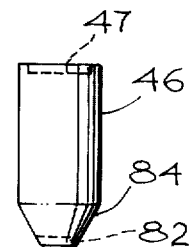
FIGS. 3A and 3B are respectively front and side elevational views of a particular element of the apparatus of FIG. 1.
Figure 3B:
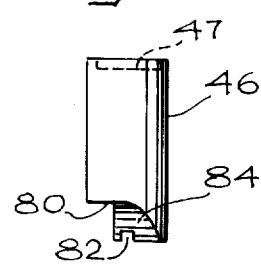

FIGS. 3A and 3B show particular details of the configuration of the inner conductor 46 of the single transmission line 44 of FIG. 1, by virtue of which the operation of the device is materially improved. At the upper end of the device 46, a recess 47 is shown adapted to receive the lower end of the adjacent diode. The lower end of the conductor 46 has a "tailored" cutout or notch 80 together with a transverse slot 82 and a tapered portion 84. The tapered portions 84 permit the conductors 46 to be positioned closer to the center of the device 30 as well as closer to each other, permitting a smaller size to be realized with improved operation. The slot 82 is provided to fit snugly over the parasitic suppression resistor 52 (FIG. 1) on the dielectric substrate 54.

The notches 80, when the conductors 46 are aligned as shown in FIG. 1, are all positioned to accommodate a further insertion of the RF coupling plate 64, thus providing closer coupling between the plate 64 and the transmission lines 44 as well as serving to attenuate certain spurious modes of oscillation which might otherwise occur in the cavity region between the resistor plate 54 and the coupling plate 64. Test results have shown a marked improvement in performance of the device with the cutout notches 80, as contrasted with a device having conductors 46 without the notch 80. The spurious oscillations referred to above were attenuated with the use of the cutout elements 46, and there was also an increase of approximately 20% in output power as a result of the closer coupling afforded by the notched elements 46.

Although there has been described hereinbefore a specific embodiment of a multi-diode solid state microwave oscillator in accordance with this invention for the purpose of illustrating the manner in which the invention may be used to advantage, it will be appreciated that the invention is not limited thereto. Accordingly, any and all modifications, variations, or equivalent arrangements which may occur to those skilled in the art should be considered to be within the scope of this invention.

What is claimed is:

1. A multiple-diode microwave oscillator including, in combination:
   a housing having an axis;

a plurality of avalanche diodes;

a plurality of coaxial transmission lines, each coupled to a corresponding one of said plurality of avalanche diodes to form a plurality of signal generating units, each of said coaxial transmission lines comprising a radially directed, circular cylindrical opening in the housing, an inner conductor centrally spaced within the opening, and a dielectric spacer surrounding the inner conductor and separating it from and affixing it in position within the housing;

means carried by said housing and including an axially positioned common conductor for conductively coupling operating signals to each of said signal generating units;

said signal generating units being disposed within said housing radially about said common conductor; and means for combining, at the same desired frequency, the power from all of said generating units.

2. Apparatus according to claim 1 including, in addition, a source of operating signals connected to said coupling means, said operating signals being predetermined to cause said avalanche diodes to operate in the IMPATT mode.

3. Apparatus according to claim 1 in which the number of signal generating units in said plurality is six.

4. Apparatus according to claim 1 in which said means for conductively coupling operating signals includes series-connected parasitic suppression resistor elements.

5. Apparatus according to claim 1 in which each of said transmission lines is one-quarter wavelength long at the desired operating frequency.

6. Apparatus according to claim 5 in which each of said transmission lines is connected through its respective series resistor element to one end of said common conductor.

7. Apparatus according to claim 6 in which said common conductor has its end remote from said series resistor elements grounded for RF signal purposes.

8. Apparatus according to claim 1 in which said combining means includes an output connector supported by said housing and having an inner conductor; and a capacitive coupling plate carried by said inner conductor and positioned in proximity to said plurality of transmission lines.

9. Apparatus according to claim 8 in which said output connector is supported adjustably in said housing, whereby upon adjustment of said connector the position of said coupling plate with respect to said transmission lines is adjusted.

10. Apparatus according to claim 8 in which said capacitive coupling plate is positioned proximate to those ends of said transmission lines remote from said diodes.

11. Apparatus according to claim 1 which includes, in addition, a plurality of collets each carrying one of said diodes and collet mounting means adjustably supporting each of said collets in said housing.

12. Apparatus according to claim 11 in which said collet is metallic.

13. Apparatus according to claim 12 in which said collet mounting is metallic, whereby said collet is electrically connected to said housing.

14. Apparatus according to claim 1 which includes, in addition, a plurality of collets each carrying one of said diodes; collet mounting means adjustably supporting each of said collets in said housing; said collet mounting means being adjustable relative to the housing to bring each of said diodes into firm contact with said inner conductor of a respective one of said plurality of transmission lines.

15. Apparatus in accordance with claim 1 wherein each inner conductor has an inner end shaped to accommodate the positioning of adjacent elements mounted within the housing.

16. Apparatus in accordance with claim 15 wherein each inner conductor has a tapered inner end shaped to match the taper of corresponding conductors of adjacent transmission lines radially oriented about the common conductor within the housing.

17. Apparatus in accordance with claim 1 wherein the first-mentioned means includes a centrally-positioned resistor plate and wherein each inner conductor includes a slotted inner end shaped to receive an adjacent edge of the resistor plate in electrically connecting relationship.

18. Apparatus in accordance with claim 1 wherein the combining means comprises a centrally-positioned coupling plate movable along the housing axis for variably coupling to the signal generating units and wherein each inner conductor includes a notched inner end, the inner conductors being oriented within the housing so that the notches of all provide a space to receive the coupling plate in closer proximity thereto.

19. Apparatus in accordance with claim 14 wherein the outer end of each inner conductor includes a recess configured to mate with and receive the inner end of the associated diode in electrical and heat-conductive connection therewith.

20. Apparatus in accordance with claim 19 wherein each collet is adjustable within the associated collet mounting means to tighten the grip of the collet on the outer end of the associated diode.

21. Apparatus in accordance with claim 17 wherein the resistor plate comprises a dielectric substrate and a plurality of parasitic-suppression resistor elements deposited thereon, one for each signal generator aligned therewith.

22. Apparatus in accordance with claim 14 wherein the outer end of each cylindrical opening is threaded to receive a corresponding threaded portion of an associated collet mounting means positioned therein.

* * * * *